United States Patent
Diffily et al.

(10) Patent No.: US 7,483,453 B2
(45) Date of Patent: Jan. 27, 2009

(54) FREQUENCY SETTING OF A MULTISECTION LASER DIODE TAKING INTO ACCOUNT THERMAL EFFECTS

(75) Inventors: Ronan Diffily, Dublin (IE); David McDonald, Dublin (IE); Tommy Mullane, Dublin (IE)

(73) Assignee: Intune Technologies Limited, Dublin (IE)

( * ) Notice: Subject to any disclaimer, the term of this patent is extended or adjusted under 35 U.S.C. 154(b) by 212 days.

(21) Appl. No.: 10/540,087

(22) PCT Filed: Dec. 19, 2003

(86) PCT No.: PCT/IE03/00172

§ 371 (c)(1),
(2), (4) Date: Jan. 20, 2006

(87) PCT Pub. No.: WO2004/057713

PCT Pub. Date: Jul. 8, 2004

(65) Prior Publication Data

US 2006/0153253 A1 Jul. 13, 2006

(30) Foreign Application Priority Data

Dec. 20, 2002 (EP) .................................. 02258922

(51) Int. Cl.
*H01S 3/098* (2006.01)
*H04B 10/04* (2006.01)
*H04B 10/12* (2006.01)

(52) U.S. Cl. ........................................ 372/18; 398/196
(58) Field of Classification Search .................. 372/18; 398/196

See application file for complete search history.

(56) References Cited

OTHER PUBLICATIONS

Sarlet et al. "Control of widely tunable SSG-DBR lasers for dense wavelength division multiplexing", Aug. 2000.*

* cited by examiner

*Primary Examiner*—Minsun Harvey
*Assistant Examiner*—Marcia A. Golub
(74) *Attorney, Agent, or Firm*—McDonnell Boehnen Hulbert & Berghoff LLP

(57) ABSTRACT

A system in which the controller (24) of a multi section diode laser such as a SG-DBR (10) is configured so that the laser can be swept rapidly in a pre-determined frequency direction through a series of frequency points by asserting a pre-calibrated series of sets of control input values to the sections of the diode laser, wherein the frequency points are obtained from cavity modes in a plurality of different supermodes, and the sets of control input values are pre-determined to take account of thermal transients that are known to arise from jumps in the output modes that occur when sweeping through the pre-calibrated series of sets of control input values in the pre-determined frequency direction.

16 Claims, 9 Drawing Sheets

"Prior Art"

"Prior Art"

"Prior Art"

FREQUENCY SETTING OF A MULTISECTION LASER DIODE TAKING INTO ACCOUNT THERMAL EFFECTS

BACKGROUND OF THE INVENTION

The invention relates to a multisection laser diode system that can be operated over a range of frequencies and a method of operating such a system.

The original multisection diode laser is a three-section tunable distributed Bragg reflector (DBR) laser. Other types of multisection diode lasers are the sampled grating DBR (SG-DBR) and the superstructure sampled DBR (SSG-DBR) which both have four sections. A further multisection diode laser is the grating-assisted coupler with rear sampled or superstructure grating reflector (GCSR), which also has four sections. A review of such lasers is given in Chapter 2 of PhD by Geert Sarlet, University of Gent, Belgium (September 2000) "Tunable laser diodes for WDM communication—Methods for control and characterisation"

Multisection diode lasers are useful in wavelength division multiplexed (WDM) systems. Typically, WDM systems have channel spacings conforming to the International Telecommunications Union (ITU) standard G692, which has a fixed point at 193.1 THz and inter-channel spacings at an integer multiple of 50 GHz or 100 GHz. An example dense WDM (DWDM) system could have a 50 GHz channel spacing and range from 191 THz to 196 THz (1525-1560 nm).

FIG. 1 is a basic schematic drawing of a SG-DBR laser 10. The laser 10 comprises back and front reflector sections 2 and 8 with an intervening gain or active section 6 and phase section 4. An antireflection coating 9 can be provided on the front and/or rear facet of the chip to avoid facet modes. The back and front reflector sections include reflectors which take the form of sampled Bragg gratings 3 and 5.

The raison d'être of multisection diode lasers is their wavelength tunability. Each section of the laser diode is supplied with a drive current, and the lasing wavelength is a function of the set of drive currents, this function generally being quite complex. Setting the output wavelength of such a laser is thus usually performed by a sophisticated microprocessor controlled control system. As well as the fact that there is a complex relation between output wavelength and the set of drive currents, there is the additional factor that wavelength switching of the laser destroys its thermal equilibrium, which results in transient wavelength instabilities until thermal equilibrium is reached at the new set of drive currents. The time needed for temperature stabilisation can be quite long.

FIG. 2 is a schematic representation of an output characteristic (or mode map) of a SG-DBR laser as a function of the currents applied to the front and back reflectors ($I_f$ and $I_b$ respectively). The mode map is made up of a number of operating cells, each occupying its own area in front and back current space. Each cell in the mode map corresponds to a coincidence in frequency space of reflectivity peaks for both the front and back reflectors with a cavity mode of the active section 6. An aligned pair of reflectivity peaks for the front and back reflectors may be tuned (by altering $I_f$ and $I_b$) to coincide with one of a set of cavity modes. This set of cavity modes is collectively known as a supermode. The cells labelled 'A' to 'L' belong to one supermode, while the cells labelled 'M' through 'W' belong to another. Accordingly, each supermode occupies a branch of current space on the mode map. The most stable operating points for the laser in terms of values of $I_f$ and $I_b$ are those which lie at the centre of a cell, away from mode hop boundaries which define the cell edges. An example of a stable operating point of this kind is point 7 in cell H. While each cavity mode is generally associated with a cavity mode frequency of the active section, the phase current $I_{ph}$ may also be used to fine tune the laser within a cell. Each cell has a phase tuning range available to it, which is typically of the order of ±25 GHz. Beyond this tuning range the effective cavity length of the active region is sufficiently altered for the laser to be forced into the next highest (or lowest) cavity mode in that supermode.

The transient thermal properties of a SG-DBR laser result in two main effects.

A first effect is that, directly after the laser is switched, the thermal gradient across the device to the heatsink, upon which it is mounted, will be different to that measured at steady state operating conditions for the same currents, due to a different heating level generated in the laser as the currents are different. The steady state temperature gradient will reassert itself over a period measured in a timescale from a few hundred nanoseconds to tens of microseconds. Because the device is at a different temperature during this period some temperature tuning of the wavelength occurs. For a positive (negative) change in tuning current the change in temperature will be such that the device is initially colder (hotter) than at equilibrium for those currents and some time will pass before the extra current dissipates enough heat energy to change this. During that period the device will be colder (hotter) than expected so a blue (red) shift from the expected output wavelength will occur.

A second effect takes place over a much longer timescale. The laser is thermally connected to a heat sink of finite thermal mass which has a temperature controller maintaining its temperature. The temperature controller cannot react instantaneously to a change in temperature, which means that with an increase (decrease) in bias current, the heat sink will heat up (down). This temperature change results in the temperature of the device overshooting and going higher (lower) than would be normal for those currents. This effect will persist until the temperature controller returns the heat sink to its normal temperature, which may take 1-1.5 seconds.

A known technique of addressing the transient (and non-transient) thermal effects, and also any other effects that cause the wavelength to deviate from the intended wavelength for a predetermined set of drive currents, is to provide a wavelength measuring system which supplies measurements of the output wavelength to the control system. The laser drive current can then be adjusted in a feedback loop to provide locking of the output to the desired output wavelength.

FIG. 3 shows a typical application example where a SG-DBR laser 10 is used as a source for a WDM system, with a microprocessor control system being provided for wavelength locking. The SG-DBR 10 has a pigtailed output connection to an optical fibre 20. An optical coupler 12 is arranged in the optical fibre output path 20 to couple off a small proportion of the output power, for example 5%. The coupler 12 may be a fused taper coupler, for example. The part of the output beam diverted off by the coupler 12 is supplied to an optical wavelength locker 14, for example a JDS FPWL211501100 series wavelength locker. The optical wavelength locker 14 is a wavelength measuring device based on a Fabry-Perot etalon or other device.

FIG. 4 shows the frequency response of a power normalised etalon response in terms of its percentage throughput T as a function of frequency f. For WDM applications, the etalon is designed to have its cyclical frequency response (or Free Spectral Range (FSR)) matched to the ITU grid. In this example, an etalon with a FSR of 50 GHz has been chosen so as to match to the 50 GHz channel spacing of the ITU C-band. Consequently, each of the ITU frequencies lies on a point on the etalon response with the same values of both T and dT/df. An etalon with a sinusoidal frequency response has been assumed. The laser output can thus be tuned to any one of a number of discrete frequency channels separated by a fixed channel spacing matched to the etalon response period.

The frequency response of the etalon is such that an ITU channel frequency occurs on the maximum positive slope of the etalon peaks, i.e. maximum positive value of dT/df, as indicated in the figure. (Alternatively, the maximum negative slope points could be chosen.) The optical wavelength locker 14 includes first and second photodiodes PD1 and PD2. Photodiode PD1 is arranged to receive light transmitted by the etalon. Accordingly, if the output frequency of the laser is, for example, greater than the ITU frequency, the photodiode PD1 will receive a higher incident power level P1 than it would at the ITU channel frequency. Similarly, if the output frequency of the laser is below the ITU channel frequency, the power P1 incident on the photodiode PD1 will be lower than the value it would have if the laser output was at the ITU channel frequency. The photodiode PD1 thus outputs a voltage $V_{pd1}$ that can be used as a basis for generating an error signal relating to the frequency deviation of the laser output from the ITU channel frequency.

The second photodiode PD2 of the optical wavelength locker is arranged to measure the optical power input to the locker 14, thereby providing a measure of the total output power of the laser in the form of a measurement voltage $V_{pd2}$. The measurement voltages $V_{pd1}$ and $V_{pd2}$ are supplied by respective signal lines 16 and 18 to an analogue-to-digital converter (ADC) 22. The ADC 22 may for example have 12 bit resolution. The ADC 22 supplies the digitised measurement voltages $V_{pd1}$ and $V_{pd2}$ to a microprocessor 24 which may be connected to ancillary computer equipment through an interface 26.

When initially setting the laser 10 to a given ITU channel frequency, the microprocessor 24 refers to a predetermined set of drive voltages $V_f V_b V_g$ and $V_{ph}$ for the ITU channel frequency concerned. The sets of drive voltages may be conveniently held in a look-up table (LUT). The microprocessor 24 may thus include on-chip memory for this purpose, for example flash memory. To set the laser 10 to a particular ITU channel frequency, the microprocessor 24 asserts a set of voltages to a digital-to-analogue converter (DAC) 28. The DAC 28 may have 14 bit resolution, for example. The DAC 28 then supplies these voltages to a driver circuit 30 which converts the voltages to corresponding drive currents $I_f I_b I_g$ and $I_{ph}$ which are then applied to the front reflector, back reflector, gain and phase sections 8, 2, 6 and 4 respectively of the SG-DBR 10. A portion of the LUT may look as follows:

| Channel No. | Gain  | Phase | Front | Back |
|---|---|---|---|---|
| 1 | 11823 | 1417 | 767 | 7064 |
| 2 | 12102 | 1539 | 812 | 7132 |
| 3 | 12674 | 1612 | 856 | 7132 |
| 4 | 12698 | 1655 | 952 | 7349 |

The numbers are bit values supplied to the DAC 28 in order to generate a suitable set of output voltages for each ITU channel.

Feedback from the optical wavelength locker 14 is provided in this control system by the microprocessor 24 continually re-adjusting the set of voltages sent to the DAC 28 on the basis of the measured voltages $V_{pd1}$ and $V_{pd2}$. The feedback adjustment is implemented principally through varying $I_{ph}$, the current applied to the phase section 4 of the SG-DBR 10.

Standard prior art systems, such as described above, are designed to provide stable output at frequencies at ITU channel frequencies, typically 50 or 100 GHz apart. However, it is desirable for other applications to be able to provide stable output at an arbitrary frequency and to be able to sweep through a frequency range in a continuous, or at least quasi-continuous, manner, for example in steps of 2 GHz. A system with such capabilities would for instance be useful for the calibration of passive optical components over a broad range in frequencies, as described in "Wavelength analysis of photonic components using a fast electronically tunable laser", T. Mullane, D. McDonald, T. Farrell, International Optical Communications, pages 22-24, Spring 2002.

The standard 50 GHz etalon is an inexpensive mass produced item, but is clearly not ideally suited to locking to non-ITU frequencies, especially to frequencies where dT/df is small, such as at the maxima of T. Moreover, the values of both T and dT/df are different at different frequency values within a cycle of the etalon response making any feedback more complex to implement. Standard WDM systems make no provision for tuning to arbitrary frequencies on the etalon response curve and are reliant upon locking to a single value of T and dT/df. Other schemes use transform functions to linearise the response which requires processing of the data or a non-linear element which normalises the slope of the wavelength locker to a constant value.

FIG. 5 shows an etalon response curve with three target frequencies ($f_1$, $f_2$, $f_3$) indicated. Frequency $f_1$ lies at the centre of the response curve at a point corresponding to one of the ITU channel frequencies shown in FIG. 4. Also shown in FIG. 5 are the upper and lower bounds for effective locking to this frequency using a conventional locking circuit, namely $f_{upper}$ and $f_{lower}$. The locking circuit operates by supplementing one or more of the operating currents with a feedback signal which is determined by the difference between the measured response of the etalon and the expected response of the etalon at the target frequency. It is important to note that a given transmission response from the etalon is degenerate in output frequency because of the periodicity in the etalon response such that each value of T (and respective value of dT/df) corresponds to more than one frequency. It is not possible to discriminate between the various ITU frequencies by simply observing the output response of the etalon. Consequently, the locking circuit can only provide an appropriate feedback signal for operating frequencies which lie within the same half period of the etalon response as the target frequency. That is, the locking range of the system is equal to one half period of the etalon response.

At frequency $f_1$, it is seen that the locking range is symmetrical, with a full quarter period of the response curve being available in either direction in frequency from $f_1$. In contrast, for target frequencies other than those which lie near to the centre of the etalon response, the locking range becomes distinctly asymmetric. Frequency $f_3$ for example has only a small locking range for frequencies higher than $f_3$ while for frequencies lower than $f_3$ the locking range is much larger. The opposite is true for target frequency $f_2$. Furthermore, it can be seen that the slope of the response curve varies with frequency. Accordingly, the sensitivity of the feedback circuit is greatly reduced for frequencies approaching the extrema of the response curve (i.e. $f_{upper}$ and $f_{lower}$).

The asymmetry in the locking range and the variability in the sensitivity of the feedback circuit are therefore both functions of frequency and degrade the feedback efficiency when attempting to stabilise at frequencies away from ITU frequencies.

As well as considering the effects that thermal transients have on the feedback control implemented through an etalon, it is also necessary to consider the effects that thermal transients have when switching between different cells in the mode map, as is necessary when sweeping frequency over larger ranges. To provide a laser diode that can be tuned continuously through a significant range of frequencies, drive currents corresponding to operating points within a number of different operating cells will have to be employed. When switching between operating cells, the associated changes in the drive currents will give rise to thermal transients, which as well as causing an error in the output frequency will also distort the mode map of the laser. For example, while a cavity mode may occupy a first region in (front and back) current space in thermal equilibrium, the same cell may occupy a slightly different region in current space in the presence of thermal transients on switching. This effect can complicate the switching of currents between operating cells since the target operating cell position is time dependent during the period immediately after the mode jump.

If the operating cells are significantly shifted, it is even possible that the selected operating point on the distorted mode map may lie in an operating cell other than the target cell. In this event, the laser diode would begin to operate in an undesired operating cell at an arbitrary unenvisaged frequency. Furthermore, the locking circuit would be unable to compensate for this error since the output frequency would be likely to be outside the locking range for that target frequency and in any case the locking circuit (which predominantly employs phase tuning) can only provide effective tuning within a single cell (i.e. the target cell).

It is therefore desired to provide a laser diode which is robust against thermal transient effects and which can be operated over a fine frequency grid. In particular, it is desired to provide a laser diode that can be tuned rapidly in a quasi-continuous manner through a range of frequencies on a fine frequency grid.

SUMMARY OF THE INVENTION

According to the invention there is provided a system comprising: a multisection diode laser with a plurality of sections that are drivable by control inputs to select a desired output mode from among a plurality of available output modes; a wavelength locker for locking the selected output mode to a target frequency where the wavelength locker has a characteristic response period and there are at least 2 target frequencies in each response period of the wavelength locker; and a controller operable to sweep the diode laser in a pre-determined frequency direction through a series of frequency points by asserting a pre-calibrated series of sets of control input values to the sections of the diode laser and using the wavelength locker to lock to each of the frequency points, wherein the frequency points are obtained from cavity modes in a plurality of different supermodes, and the sets of control input values are pre-determined to take account of thermal transients that are known to arise from jumps in the output modes that occur when sweeping through the pre-calibrated series of sets of control input values in the pre-determined frequency direction.

By taking account of the previous output mode of the laser when defining the control input values to be set to obtain the next output mode, the wavelength locker and controller can lock onto each frequency point much more quickly than if the control input values were simply taken from the thermal equilibrium state for the next output mode.

The controller is preferably also operable to allow sweeping in the opposite frequency direction. Namely, the controller is preferably further operable to sweep the diode laser in the opposite frequency direction by asserting a further pre-calibrated series of sets of control input values to the sections of the diode laser, wherein the further pre-calibrated sets of control input values take account of thermal transients that are known to arise from jumps in the output modes that occur when sweeping through the further pre-calibrated series of sets of control input values in the opposite frequency direction.

Thermal transient effects that depend on the previous output mode can be taken account of by adopting a frequency skewing policy. This can be defined by setting the control input values as follows: at least one of the sets of control input values has control input values that deviate from their thermal equilibrium values by amounts dependent on the difference between the sum of its own control input values and those of the set of the preceding frequency point.

Thermal transient effects that depend on the previous output mode can also be taken account of by adopting a cell skewing policy. Namely, each set of control input values can be considered to define an operating point in drive current space. Drive current space is subdivided into cells defined by the output modes of the laser. According to the cell skewing policy, at least one of the sets of control input values is pre-calibrated so that it defines an operating point that is offset from the central region of its cell in a direction of a predicted transient thermal shift in the cell when arrived at by jumping from the preceding operating point.

Thermal transient effects that depend on the previous output mode can also be taken account of by adopting a policy of restricting supermode jumps to frequencies that lie in an optimum part of the wavelength locker response. Supermode jumps will in general result in the largest changes in thermal loading of the diode, e.g. the L to M transition of FIG. 2. Consequently, supermode jumps impose the most stringent requirements on the feedback loop. The supermode jump policy adopted is therefore that, when a set of control input values defines an output mode in a different supermode from the output mode of the preceding set of control input values, the set of control input values is pre-determined so that the jump to that output mode is made to occur at a frequency midway between adjacent minima and maxima of the response of the wavelength locker (and not at any other frequency which is not midway between the adjacent minima and maxima of the response of the wavelength locker). The capture range of the wavelength locker is maximised at this point in its response, and is made to coincide with the transition which results in the maximum frequency transient, which results when moving between supermodes in a swept frequency fashion. It will be understood that midway means as close as possible to the half-way point between the adjacent maxima and minima. In practice, anywhere not too close to the extrema will be sufficient and beneficial. Adoption of this policy should avoid the output frequency of the laser having to pass over a maximum or minimum in the wavelength locker response when recovering from thermal effects after a supermode jump.

It is beneficial for practical reasons to use a standard wavelength locker designed for WDM applications, wherein the response period of the locker matches the ITU grid. The response period of such a locker will typically be 50 GHz or 100 GHz.

In embodiments of the invention, there are at least 4, 8 or 16 frequency points in each response period of the wavelength locker.

Moreover, the frequency points are conveniently spaced apart by a constant frequency increment, preferably 2, 4, 8.33, or other sub-multiples of the FSR of the locker used.

The system preferably further comprises a control circuit operable to output a correction signal for driving the diode laser that is dependent on the difference between a measured value output from the wavelength locker and a desired value output from the controller.

In one embodiment, the wavelength locker has a response with a frequency derivative which alternates in sign (e.g. sinusoidal or more typically the Airy function form), and the control circuit is configured so that the correction signal has a magnitude independent of the sign of the difference.

In another embodiment, the wavelength locker has a response with a frequency derivative which alternates in sign, and the system comprises an inverter for inverting the measured value output of the wavelength locker at turning points in the response of the wavelength locker.

In a further embodiment, the wavelength locker has a response with a frequency derivative which is always of the same sign (e.g. sawtooth), for example a locker based on phase shift interferometry.

The control input values for each target frequency may be stored in a look up table.

Preferably, the system uses variable gain enhancement so as to normalise the wavelength locker slope. This can be achieved by incorporation of variable gain potentiometer values in the look up table.

An offset may be applied to normalise a desired locking value from the controller. The offset may be stored as part of the lookup table of the laser for each target frequency.

The invention also provides a method of sweeping a multisection diode laser in a pre-determined frequency direction through a series of frequency points by asserting a pre-calibrated series of sets of control input values to the sections of the diode laser and using a wavelength locker having a characteristic response period to lock to each of the frequency points, where there are at least 2 frequency points in each response period of the wavelength locker and wherein the frequency points are obtained from cavity modes in a plurality of different supermodes, and the sets of control input values are pre-determined to take account of thermal transients that are known to arise from jumps in the output modes that occur when sweeping through the pre-calibrated series of sets of control input values in the pre-determined frequency direction.

The multisection diode laser has a plurality of sections that are drivable by control inputs to select a desired output mode from among a plurality of available output modes.

In a further embodiment, a linear filter, more especially a low ripple response linear filter, preferably of low temperature and polarisation sensitivity, can be used as the frequency-referencing element A filter similar to the SANTEC OWL-30, with polarisation fibre input, would meet such requirement.

It will be appreciated that the invention can be implemented in a variety of multisection laser diodes, such as SG-DBR, SSG-DBR, GCSR etc.

BRIEF DESCRIPTION OF THE DRAWINGS

For a better understanding of the invention and to show how the same may be carried into effect reference is now made by way of example to the accompanying drawings in which.

DETAILED DESCRIPTION

Figure 1:
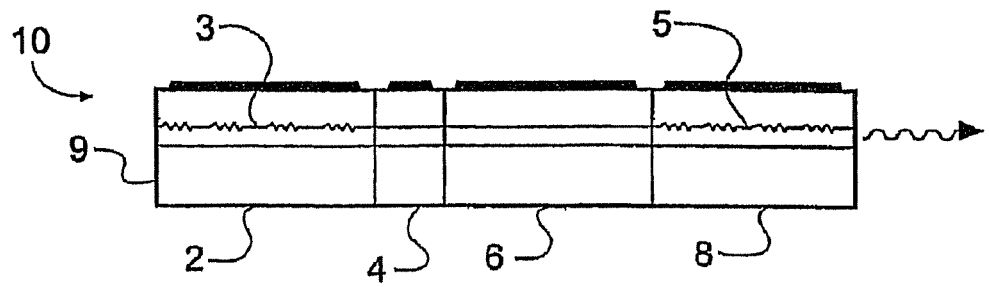
FIG. 1 shows a sampled grating distributed Bragg reflector (SG-DBR) laser diode, as known in the prior art.
Figure 2:
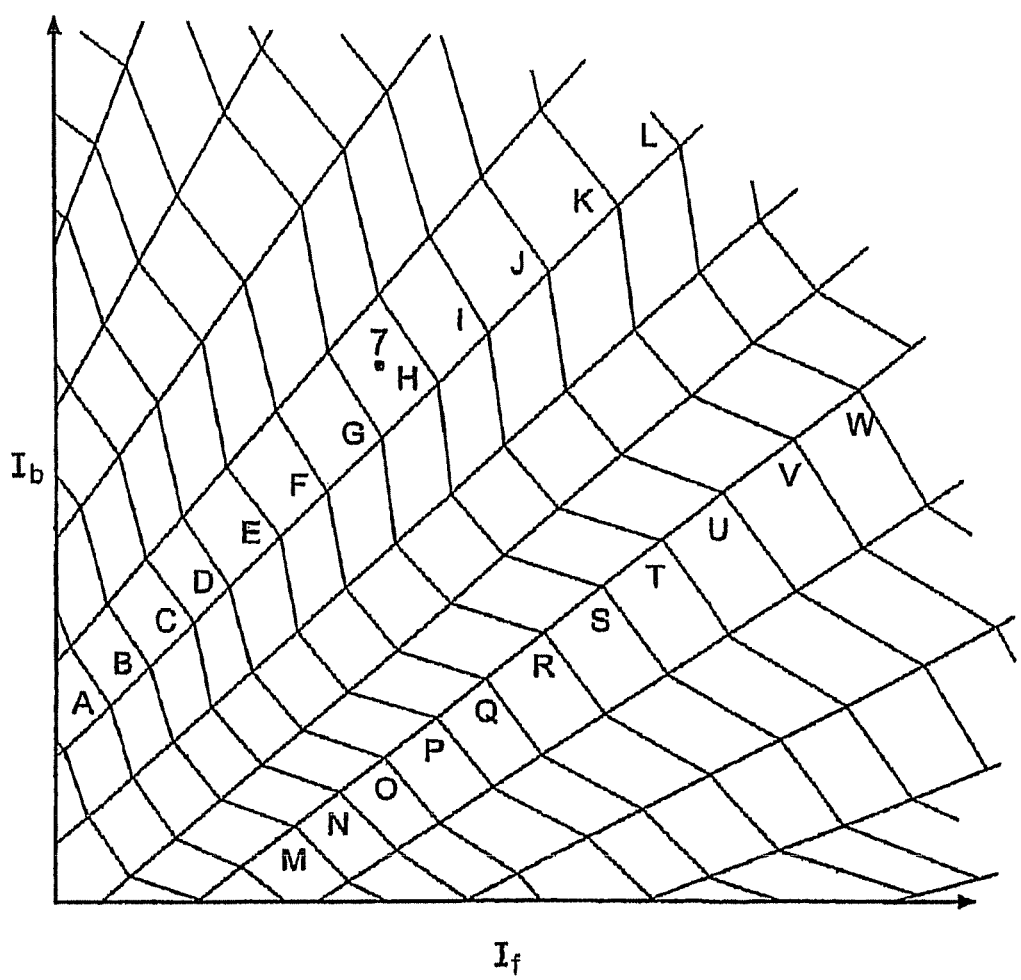
FIG. 2 is a schematic representation of the mode map of a SG-DBR laser as a function of the currents applied to the front and back reflectors ($I_f$ and $I_b$ respectively)
Figure 3:
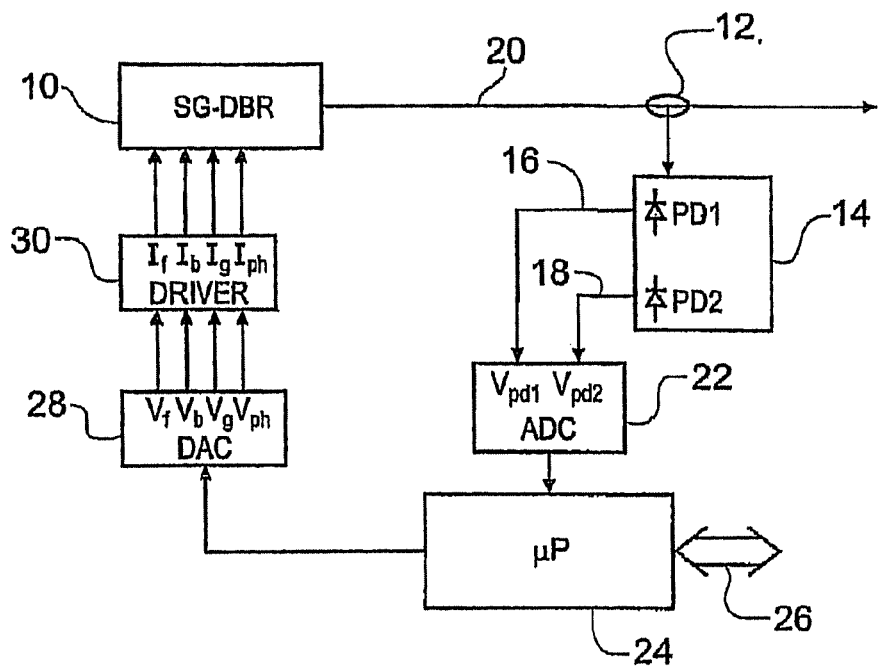
FIG. 3 shows a SG-DBR with an associated feedback control system including a wavelength locker, as known in the prior art.
Figure 4:
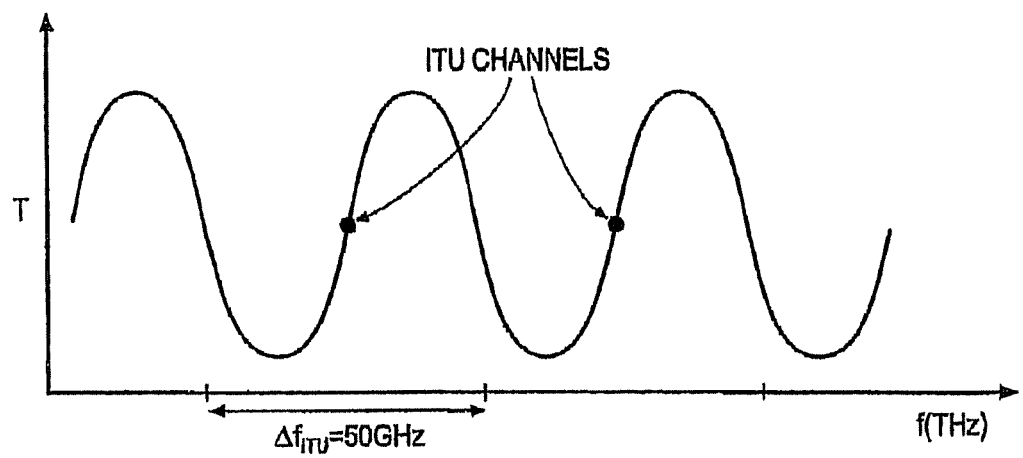
FIG. 4 shows a sinusoidal etalon response of a wavelength locker as percentage throughput T as a function of frequency f.
Figure 5:
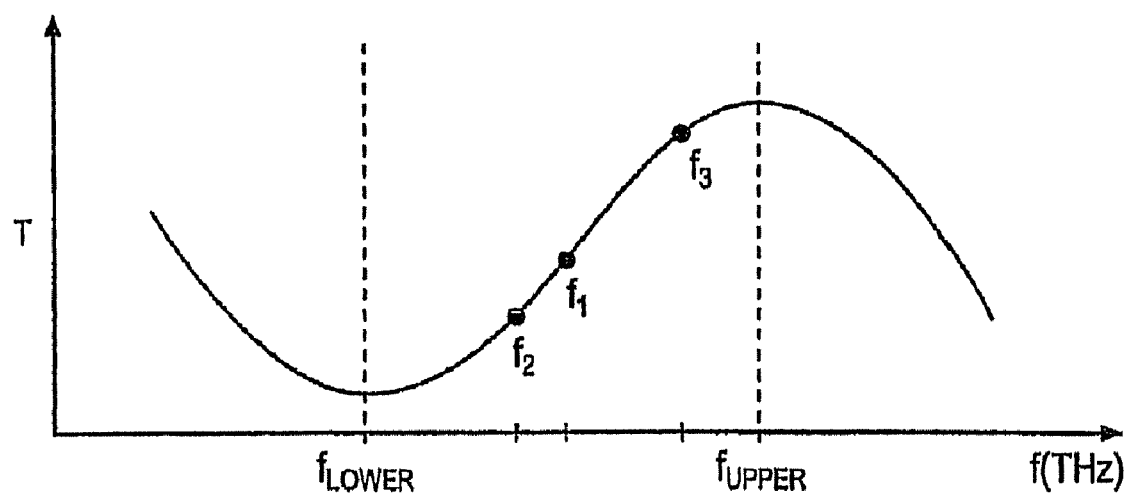
FIG. 5 shows a portion of the etalon response curve of FIG. 4 with three target frequencies ($f_1$, $f_2$, $f_3$) indicated.
Figure 6:
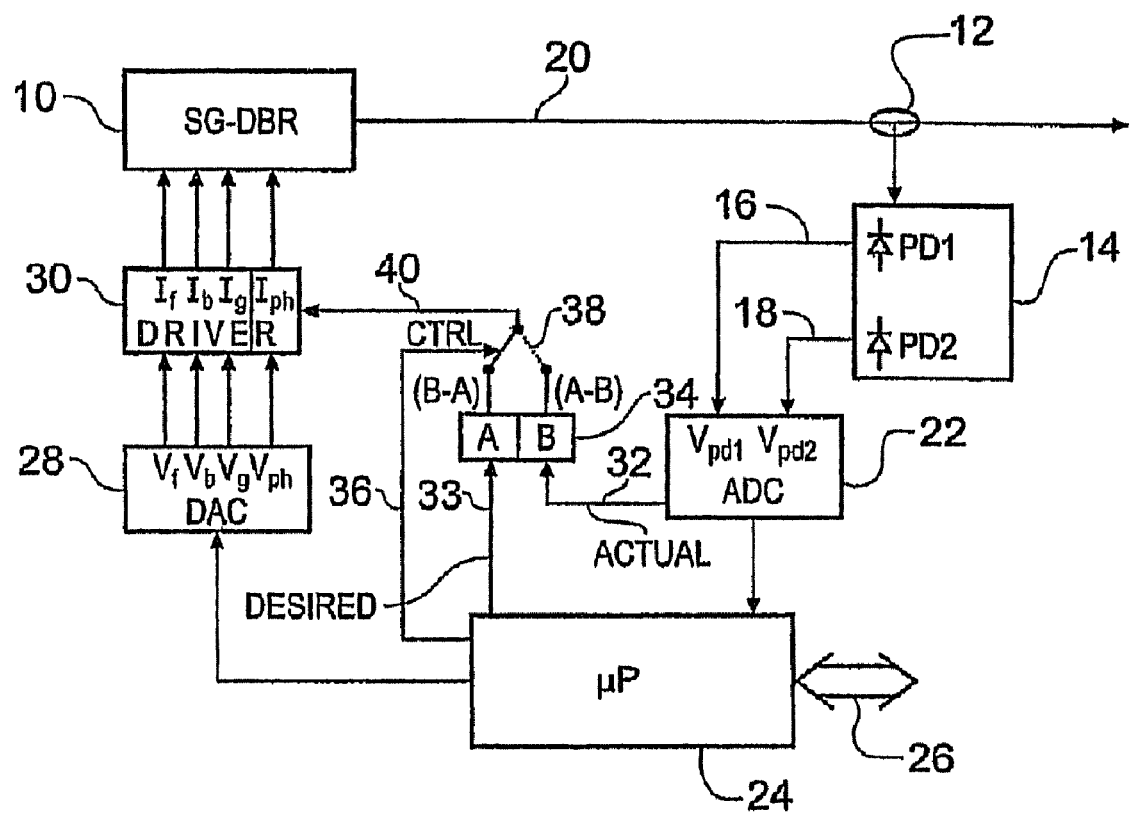
FIG. 6 shows a SG-DBR with an associated feedback control system according to a first embodiment of the invention.

FIG. 6 shows a SG-DBR with an associated feedback control system according to a first embodiment of the invention. Most of the components are the same as in the prior art example described further above. Common components are labelled with the same reference numerals, and are not generally described again for the sake of brevity. However, it is noted that the system uses the same standard 50 GHz wavelength locker 14 as in the prior art example. Notwithstanding retention of this component, the system allows quasi-continuous tuning of frequency over a 2 GHz grid, i.e. operation at any one of 25 points per etalon response. To make this performance possible, the system's control hardware and software is modified in several respects in the manner now described.

The system hardware differs from that already described by virtue of additional control components relating to regulation of the phase current $I_{ph}$. The PD1, PD2 conditioning circuitry 22 provides an output which is proportional to the instantaneous etalon transmission T. This is applied to one side "B" of a phase current control unit 34 as an "actual" value through a line 32. A "desired" value of the same parameter is supplied to the other side "A" of the phase current control unit 34 via a line 33 from the microprocessor 24. The desired value corresponds to the phase current value that the laser should receive when in thermal equilibrium. The phase current control unit 34 determines the difference between the desired and actual values. The difference is determined both as (A-B) and (B-A). Because of speed considerations, the phase current control unit 34 is preferably implemented purely in hardware, most preferably as an analogue circuit. At any given time, only one of the signals (A-B) and (B-A) is connected through to the driver circuit 30. Which one of the two is supplied depends on the position of a switch 38, which is controlled by a signal from the microprocessor 24 supplied through a control line 36. The switch is also preferably implemented as a hardware component to provide high operational speed. The switch position is toggled each time the etalon response goes through a maximum or minimum, i.e. each time the sign of dT/df changes, as determinable by the microprocessor 24. The toggling of the switch 38 ensures that the feedback is stable both sides of the turning points in the etalon response. The output from the switch 38, namely (B-A) or (A-B), is then supplied to the phase part of the driver circuit 30 as a correction signal DELTA $V_{ph}$ 40 which is summed with the basic phase voltage $V_{ph}$ to lock the phase voltage to provide a desired output. Having described the hardware changes, the software changes are now discussed.

The system software embedded in the microprocessor 24 differs from standard configuration in the way it is changed to take account of switching transients when moving through a set of finely spaced grid points in frequency space to perform a quasi-continuous frequency sweep.

Figure 7:
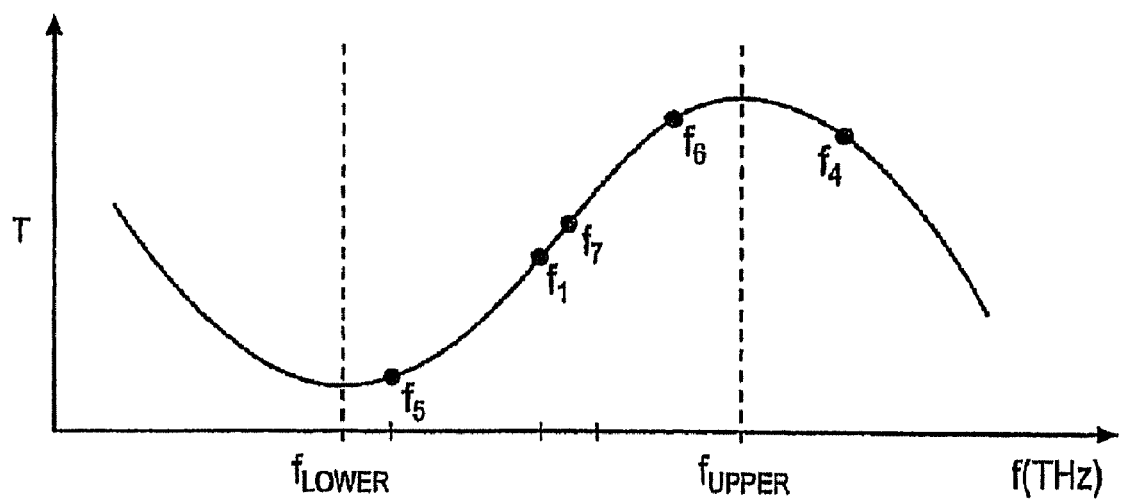
FIG. 7 shows various operating points on a sinusoidal etalon response to explain principles of a first aspect of the invention.

FIG. 7 shows various operating points on a sinusoidal etalon response to explain principles behind how the system software is modified according to a first aspect of the invention.

The largest thermal transients, and associated errors in operating frequency, occur when the operating point is switched between a cavity mode in one supermode to a cavity mode in a different supermode. Significant thermal transients can also arise when switching between non-adjacent cavity modes belonging to the same supermode. This is because mode switching of these types generally involves significant changes in the operating currents $I_f$, $I_b$ and $I_g$. On the other hand, tuning of the phase current $I_{ph}$ is associated with relatively minor thermal transients. Phase tuning is typically used to lock the laser output to a given output frequency within a single cavity mode. The phase currents supplied to a SG-DBR laser are typically two orders of magnitude smaller than gain current $I_g$.

In view of this, and in accordance with the present invention, the laser system is calibrated such that supermode jumps occur only at points on the etalon response which have a large available locking range, preferably the largest. As described above, these points correspond to frequencies which lie at an intermediate point on the etalon response curve midway between adjacent maximum and minimum points of a cyclical response function.

Tuning from grid point to grid point in between these points is achieved primarily by phase current tuning. This ensures that when tuning near to the extrema of the etalon, the output frequency is generally under close control since $I_f$ and $I_b$ have already been selected within the appropriate cavity mode and will only be changed by relatively small amounts, if at all, so that no significant thermal transients are expected.

Confining large mode jumps to midpoints in the locking range is usually effective to prevent loss of correct feedback. However, the transient thermal effects may nevertheless result in the initial output frequency of the laser after the mode jump being relatively far away from where it should be, so that the phase current feedback compensation has to work hard to relocate the output to the target frequency.

Referring to FIG. 7, it is assumed that the laser has previously been operating in a first cavity mode and is initially tuned to a frequency equal to $f_1$. The laser now jumps to a cavity mode in a different supermode (or to a distant cavity mode in the same supermode), with a target frequency equal to $f_1$. The intention is that the ranges in frequency serviced by the first and second cavity modes be contiguous. In the present example, it is assumed that the operating currents $I_f$, $I_b$ and $I_g$ at the first cavity mode are generally smaller than those at the second cavity mode. Accordingly, on jumping between supermodes, it is expected that there will be an overshoot in frequency such the actual output frequency $f_{output}$ directly after the jump is higher than $f_1$.

For initial values of $f_{output}$ between $f_1$ and $f_{upper}$ (such as $f_{output}=f_6$), a larger frequency overshoot will lead to a longer time being required to pull $f_{output}$ back to the target frequency. This delay is increased for frequencies close to $f_{upper}$ since the sensitivity of the feedback circuit is reduced. While these effects do not destabilise the feedback loop, they increase the time needed to stabilise the output after a large mode jump, which in turn reduces the achievable sweep rate of the system. In order to alleviate the problems associated with frequency overshoot/undershoot, and in accordance with an embodiment of the present invention, a policy of skewing the set frequency away from the target frequency is adopted at mode jumps, where the size of the skewing correction depends on the magnitude of the difference between the sum of the gain, forward and back currents before and after the jump, i.e. $\mathrm{mod}[(I_f+I_b+I_g)_{before}-(I_f+I_b+I_g)_{after}]$, and the direction of the skewing correction depends on the sign of the difference between these sums, i.e. whether the thermal load on the diode increases or decreases following the jump.

In the illustrated example, since it is known that on jumping from the first to the second supermode there will in general be a frequency overshoot, the set point in the second cavity mode is chosen to be lower than the intended target frequency. Here, the set point is chosen to be $f_5$, $f_5$ being a frequency lower than $f_1$. This has the effect of compensating for the expected frequency overshoot; the output frequency of the laser directly after switching may for example be in the region of $f_7$. For an initial set point of $f_1$, and assuming similar thermal transients, the value of $f_{output}$ directly after switching may well have been greater than $f_{upper}$. In any case, it is clear from the illustrated example that $f_{output}=f_7$ is significantly nearer to $f_1$ than $f_{output}$ would have been in the absence of frequency skewing of the set point. After the mode jump, the remaining difference in frequency between $f_6$ and $f_1$ may be compensated for by conventional phase tuning. It will be appreciated that directly after switching, thermal transients still exist within the laser. In this example (moving from high to low current) these will tend to force $f_{output}$ to lower frequencies. However, this may now be dealt with (again by phase tuning) from a position of advantage since the value of $f_{output}$ is already close to $f_1$.

The laser system is therefore calibrated twice for tuning between a minimum frequency and a maximum frequency, once for scanning in the direction of increasing frequency and once for scanning in the direction of decreasing frequency. In both cases, supermode jumps are confined to frequencies that lie in central portions of the etalon locking range, but in the two cases, the frequency skewing will be opposite. Using the illustrated example, the set point will be chosen to be $f_6$ when jumping from the second to the first supermode, instead of $f_5$ when jumping from the first to the second supermode.

The frequency skewing policy can be implemented in a LUT-based control by firstly calibrating the laser on a fine frequency grid, i.e. one that is much smaller than the step frequency grid that the sweep function will operate. In this situation, the frequency skewing is implemented by setting frequency points which are lower in value that the ultimate value which the overall laser output will lock to when stable. The benefit in doing this is that thermal transients which last longer than the step time of the wavelength sweep are compensated by the "effective" decreased frequency error when moving from one desired frequency to the next desired frequency. For example, for implementation of a frequency sweep over the C band of telecommunication wavelengths in a frequency step size of 8.33 GHZ, the tunable laser is first calibrated on a 2 GHz frequency grid. The transient frequency, when the system is operated in the unlocked condition, is tested to locate the largest transient frequency regions in the output sweep. Using the 2 GHz calibration data, the actual values used to update the laser output are selected on the basis of: (i) the actual transient frequency behaviour of the device under sweep conditions, (ii) the locking range of the frequency referencing element (e.g. the 50 GHz locker) at that frequency point in the sweep and (iii) the discontinuity of the net current change in the laser. The latter factor refers to the segmentation of the calibration of the laser into regions where the locking range of the frequency referencing element (e.g. the locker) is optimum.

The software control also implements a further concept for modifying the voltages asserted to the driver circuit by the microprocessor to take account of transient effects. The further concept is to take account of the distortions in the mode map pattern which occur on supermode jumps or distant cavity mode jumps where significant discontinuities in the current load occur. On such jumps each cavity mode shifts to different values of $I_f$ and $I_b$. This shifting appears over a relatively short time scale (microseconds). However, once shifted, the mode map then takes a much longer time (of order 1 second) to return to its steady state position.

Figure 8:
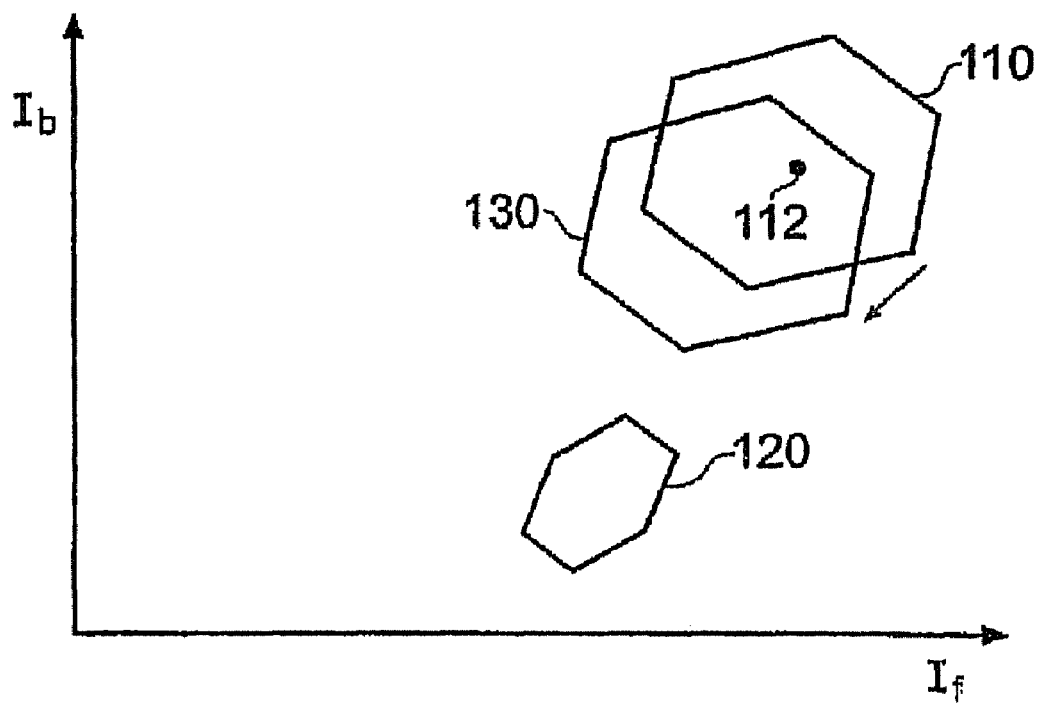
FIG. 8 shows an example of the effects of thermal transients when switching from one cavity mode to another to explain principles of a second aspect of the invention.

FIG. 8 shows an example of the distortion experienced by a cavity mode in the presence of thermal transients. Cell 110 is shown in its steady state position, with a point 112 at the centre. In this example, it is assumed that the laser is initially operating in a different cell 120, and that a jump in current is to be made to reach target cell 110. As is apparent from the figure, cell 120 occupies lower values of $I_f$ and $I_b$ than cell 110. On jumping from cell 120 to cell 110, thermal transients are expected to occur due to the relatively large and abrupt increase in operating currents. As described above, these transients cause the mode map to distort, and cell 110 shifts to lower values of $I_f$ and $I_b$, becoming shifted cell 130. Consequently, point 112 does not appear at the centre of the shifted cell 130 and the laser output frequency will differ initially from the target frequency (namely, that at point 112 in unshifted cell 110) and so will have to be arrived at by tuning the phase current $I_{ph}$. For certain technologies, this output mode map distortion is greater than others. In certain circumstances compensation for the step currents applied to the front and back tuning sections of the device may be required. After the jump, the shifted cell 130 will gradually return to the steady state position (cell 110) and point 112 will once again appear at the cell centre. This leads to a variation in frequency with time while the thermal transient effects decay. This variation in the frequency with time can be compensated for by time varying $I_{ph}$.

Figure 9:
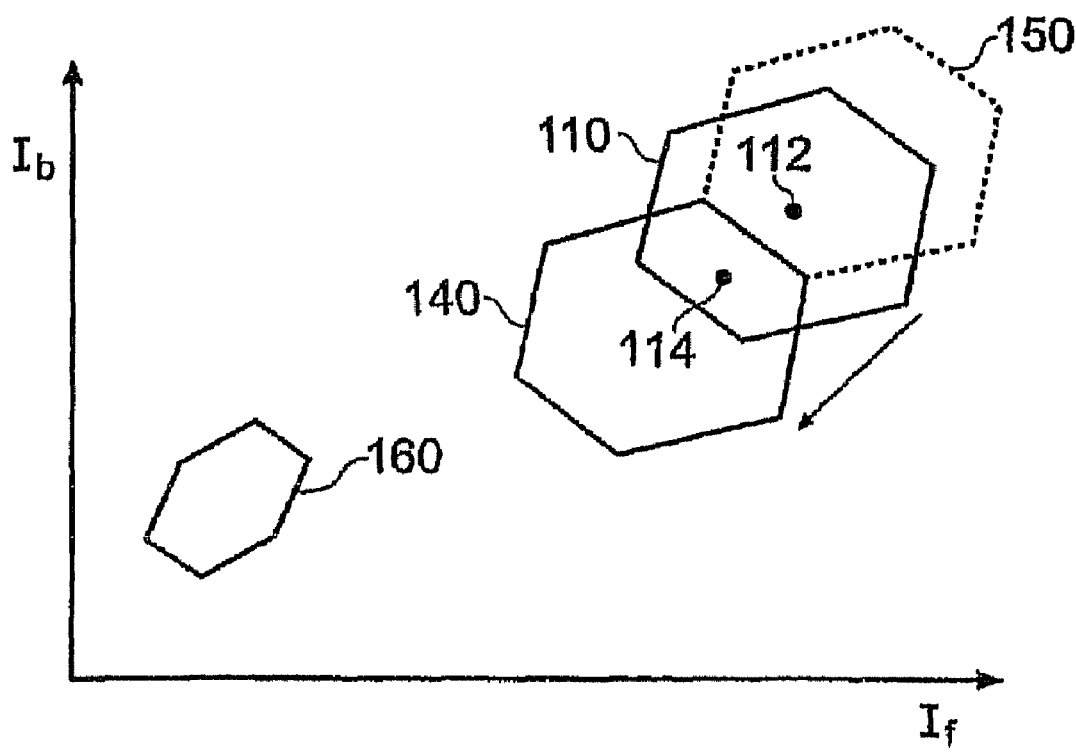
FIG. 9 shows another example of the effects of thermal transients when switching from one cavity mode to another to further explain the second aspect of the invention.

FIG. 9 shows a second example of mode distortion in which the difference in operating currents between the initial operating cell 160 and the target cell 110 is larger than that of the previous example, as depicted by shifted cell 140. In the second example, the mode pattern distortion is so great that the target cell is shifted to a position that does not overlap with point 112. In this case, if, on jumping towards cell 110 from cell 160, point 112 were chosen for operation, the operating point upon arrival would in fact lie outside the shifted target cell 140 and thus not be obtainable by phase current adjustment. Furthermore, a different cell 150, which previously occupied higher currents than cell 110, will have shifted into position over point 112. Accordingly, the set point arrives in a different cell to that which was intended. This is likely to have disastrous consequences since cell 150 will typically have a very different frequency range associated with it than that of the intended cell. Consequently, the locking circuit will not be able to drag the output frequency to the intended target frequency.

In order to avoid the events described in relation to the second example, the operating points are skewed away from the cell centre in a direction (as viewed in current space) matched to the direction of the expected thermal shift in the target cell when jumping to a given other cell. This skewing is performed in anticipation of effects due to thermal transients and can be adjusted to suit the transients predicted for a given cell to cell jump. This measure is only necessary for extreme cases in which the current discontinuity is so large that there is a risk that the target cell will not be reached initially. In other words, the off-centre skewing of the operating point may only be adopted by the control system for a limited number of the supermode jumps.

In the illustrated example, set point 114 is a skewed set point within cell 110, chosen such that it also lies within shifted cell 140. Therefore, upon jumping from initial cell 160, towards target cell 110, the operating point upon arrival still lies within the shifted cell 140, albeit at a non-central position. In addition to this, a value of $I_{ph}$ can be chosen such that the initial output frequency of the laser upon arrival at high currents is close or equal to the output frequency produced at target operating point 112. After arrival of the operating currents at point 114, the shifted cell 140 will distort back to the original steady state position of cell 110 as the thermal transient effects take their course. The frequency drift associated with the return of the cell to the steady state position may be compensated for by phase tuning.

The direction of the skewing in current space and the magnitude of the skewing will depend on, and be determined according to, the difference in drive current sets between the initial cell and target cell. It will also be appreciated that the current space considered during the calibration will in general be three-dimensional to take account of gain current, not only two-dimensional for forward and back currents as illustrated. It will also be appreciated that for different laser types the relevant current space may take account of other current components. It will be understood that the supermode jumping policy, the frequency skewing policy and the current space skewing policy are all implemented together in determining a single series of sets of control input values which will typically be stored in a LUT, although other forms of storage could be used.

An example portion of a LUT is as follows:

| Gain | Phase | Front | Back | Etalon | Etalon Sign |
| --- | --- | --- | --- | --- | --- |
| 11159 | 1859 | 6286 | 6087 | 15885 | 0 |
| 11284 | 2029 | 6361 | 6164 | 15571 | 0 |
| 11354 | 2150 | 6400 | 6203 | 15236 | 0 |
| 11710 | 2653 | 6599 | 6402 | 14891 | 1 |
| 11710 | 2653 | 6599 | 6402 | 15144 | 1 |
| 11865 | 2846 | 6678 | 6481 | 15652 | 1 |
| 12011 | 3076 | 6754 | 6560 | 16007 | 1 |
| 12160 | 3263 | 6830 | 6642 | 16169 | 1 |
| 12327 | 3506 | 6909 | 6729 | 16260 | 1 |
| 12327 | 3506 | 6909 | 6729 | 16219 | 1 |
| 12848 | 4180 | 7140 | 6938 | 16189 | 0 |
| 12971 | 4359 | 7192 | 6975 | 16219 | 0 |
| 13195 | 4669 | 7290 | 7058 | 16017 | 0 |
| 11803 | 1417 | 7267 | 7064 | 15660 | 0 |
| 11939 | 1539 | 7358 | 7148 | 15307 | 0 |
| 11939 | 1539 | 7358 | 7148 | 14881 | 0 |
| 12474 | 2018 | 7619 | 7378 | 14242 | 1 |
| 12584 | 2118 | 7672 | 7422 | 15288 | 1 |
| 8541 | 2713 | 362 | 7310 | 15834 | 1 |

-continued

| Gain | Phase | Front | Back | Etalon | Etalon Sign |
|------|-------|-------|------|--------|-------------|
| 8636 | 2982  | 373   | 7385 | 16098  | 1           |
| 8736 | 3232  | 390   | 7459 | 16230  | 1           |
| 8784 | 3343  | 399   | 7498 | 16209  | 1           |

The columns labelled gain, phase, front and back give the control input values for the different control currents in terms of the numbers of bits fed to the DAC 28 to produce the drive voltages $V_g$, $V_{ph}$, $V_f$ and $V_b$. The column labelled etalon gives the target DAC bit value of the signal T received via ADC 22 from the wavelength locker 14. The column labelled etalon sign indicates whether the gradient of the response function of the wavelength locker is positive or negative at the frequency associated with the relevant set of control input values. It will be understood that the example LUT portion is specific for sweeping in one frequency direction only and is only calibrated for jumping one column at a time through the LUT. A separate LUT will be provided for sweeping in the opposite frequency direction.

An example of a quasi-continuous scanning range according to the present embodiment is now described.

Figure 10:
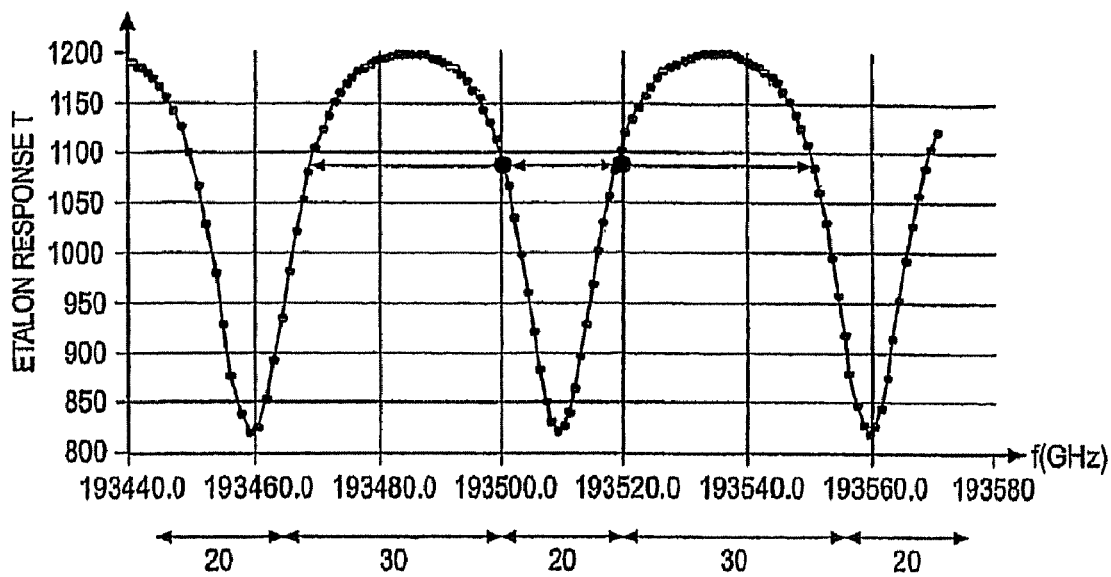
FIG. 10 shows an example set of laser output points of a laser system of the first embodiment marked on an actual etalon response.

FIG. 10 shows an example set of laser output points of a laser system of the first embodiment marked on an actual etalon response. This type of response function is typical of a Fabry-Perot etalon. The etalon has a 50 GHz period. Each period is calibrated with 50 grid points spaced apart equally in frequency by 1 GHz for quasi-continuous frequency scanning. Due to the asymmetric nature of the Fabry-Perot response function, the scanning range is split into alternate 20 and 30 GHz sections.

Figure 11:
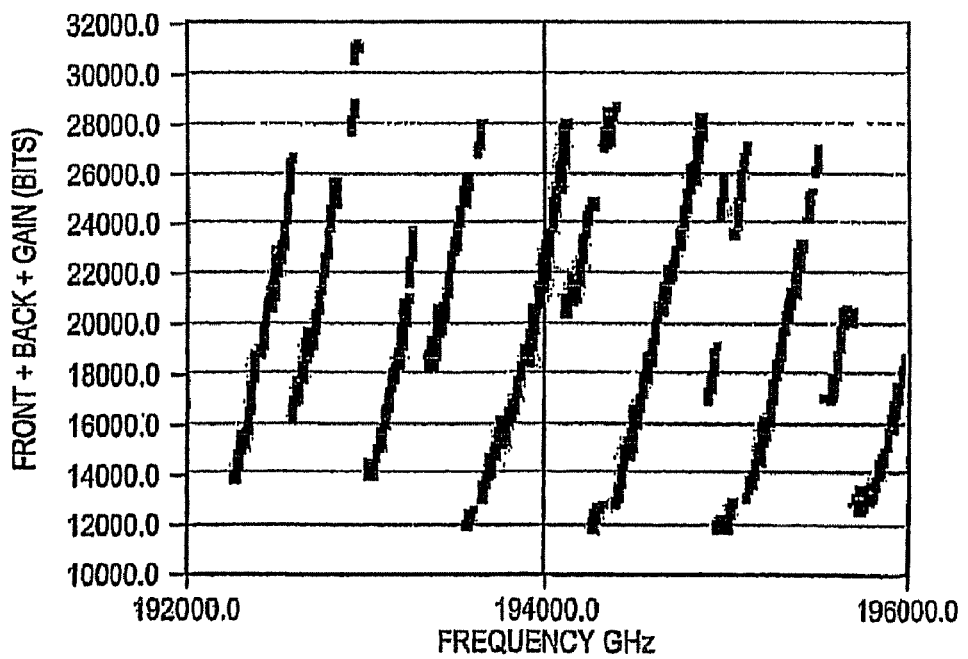
FIG. 11 is a graph for the same example as FIG. 10 showing the frequency tuning path of the laser system by plotting the sum of the front, back and gain currents in bits against frequency f, where each contiguous curve relates to one supermode, with the alternating light and dark curve portions relating to the alternating 20 and 30 GHz sections of the actual etalon response of FIG. 10.

FIG. 11 is a graph for the same example showing the frequency tuning path of the laser system. The graph plots the sum of the front back and gain currents in bits against frequency f, where each contiguous curve relates to one supermode, with the alternating light and dark curve portions relating respectively to the alternating 20 and 30 GHz sections of the etalon response.

It is apparent from the figure that the laser can be quasi-continuously scanned from around 192 THz to 196 THz in 1 GHz increments by jumping through around a dozen supermodes. Most if not all of the supermodes are followed through several cavity modes.

A further policy is also apparent from the figure. This policy is that of keeping the sum of the drive currents within as narrow a range as possible throughout the whole sweep. In terms of bits, it can be seen that the current sum is kept between about 12000 and 30000 throughout.

Figure 12:
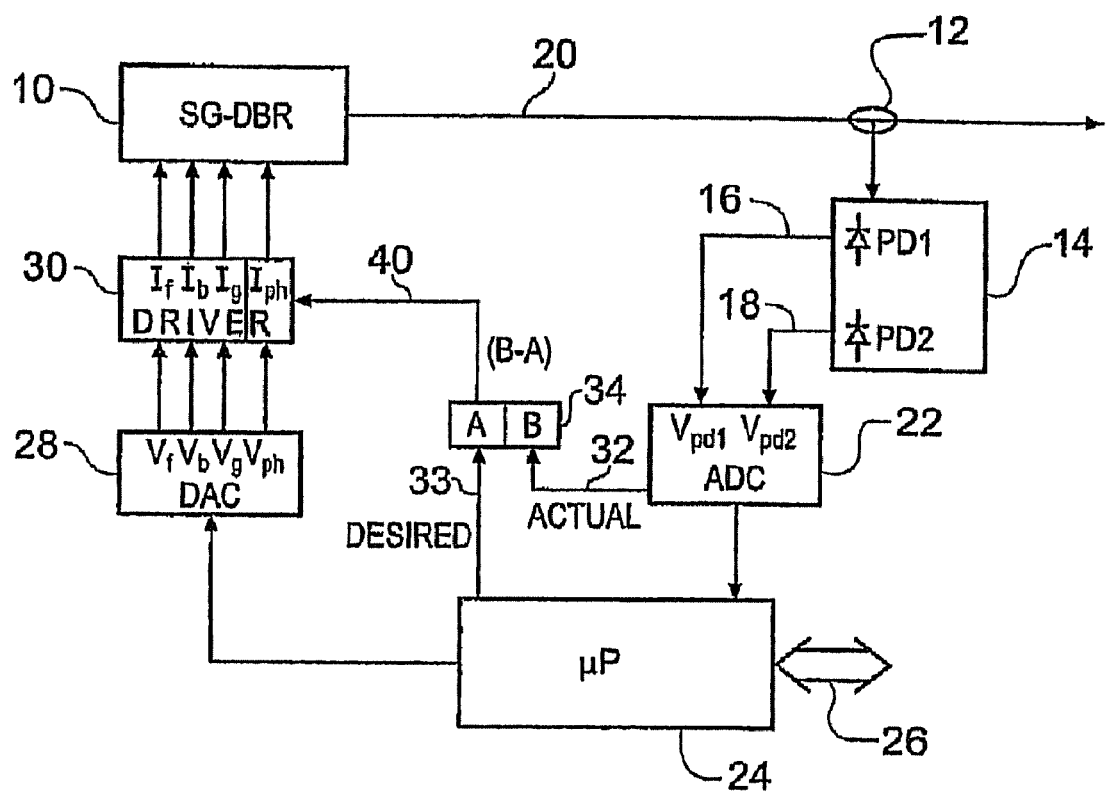
FIG. 12 shows a SG-DBR with an associated feedback control system according to a second embodiment of the invention.

FIG. 12 shows a SG-DBR with an associated feedback control system according to a second embodiment of the invention. The second embodiment differs from the first embodiment in the hardware approach adopted to cope with the changes in sign of the etalon response at the response maxima and minima. Instead of switching the sign of the correction signal supplied from the phase current control unit, as in the first embodiment, the response from the wavelength locker is electronically processed so that the response from the locker is unipolar over a full FSR of the etalon, which allows the control loop to be simpler by emulating the optical transmission response more typically found in a frequency referencing element such as a locker based on PSI techniques. The wavelength locker 14 conditioning circuitry incorporates an analogue inverter circuit that is either bypassed or not, as triggered by the microprocessor 24, co-incident with the set values on the tunable laser. This trigger signal is set/reset based on the state of the etalon sign bit of the LUT stored on the microprocessor. See the LUT example earlier.

Figure 13A:
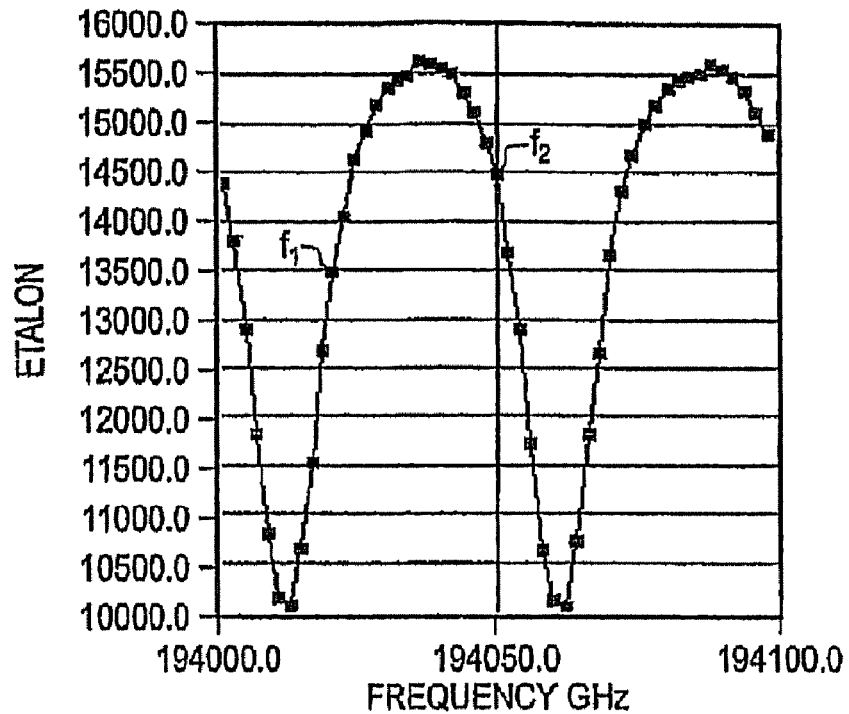
FIGS. 13a and 13b show a non-inverted etalon response according to the first embodiment and an inverted etalon response according to the second embodiment.

FIG. 13*a* shows the transmission response T for an etalon measured over a range of 100 GHz. The etalon has an FSR of 50 GHz and a finesse greater than 1. Suppose for example that the etalon is to be used in the tuning of the laser diode between $f_1$=194020 GHz and $f_2$=194050 GHz (15 grid point steps marked as points on the response curve on a 2 GHz frequency grid). Starting at $f_1$, the phase current $I_{ph}$ (and, perhaps one or more of the other operating currents) is varied in a stepwise manner so as to increase the output frequency towards $f_2$. As the phase current is incremented for each successive grid point, the feedback circuit keeps the frequency locked to the desired operating frequency by supplying a feedback signal which is determined at least in part by the difference between the value of T at the current output frequency $f_{output}$ and the expected value of T at the target output frequency $f_{target}$. However, as $f_{output}$ reaches and passes through the extremum in T located at approximately 194036 GHz, the slope in T changes sign. Accordingly, for frequencies higher than 194036 GHz, a small deviation in the output frequency would be met with a change in the feedback signal opposite to that which would be required to drag the operating frequency back to the target frequency. Consequently, the locking circuit is only able to function for one half of the overall lineshape.

Figure 13B:
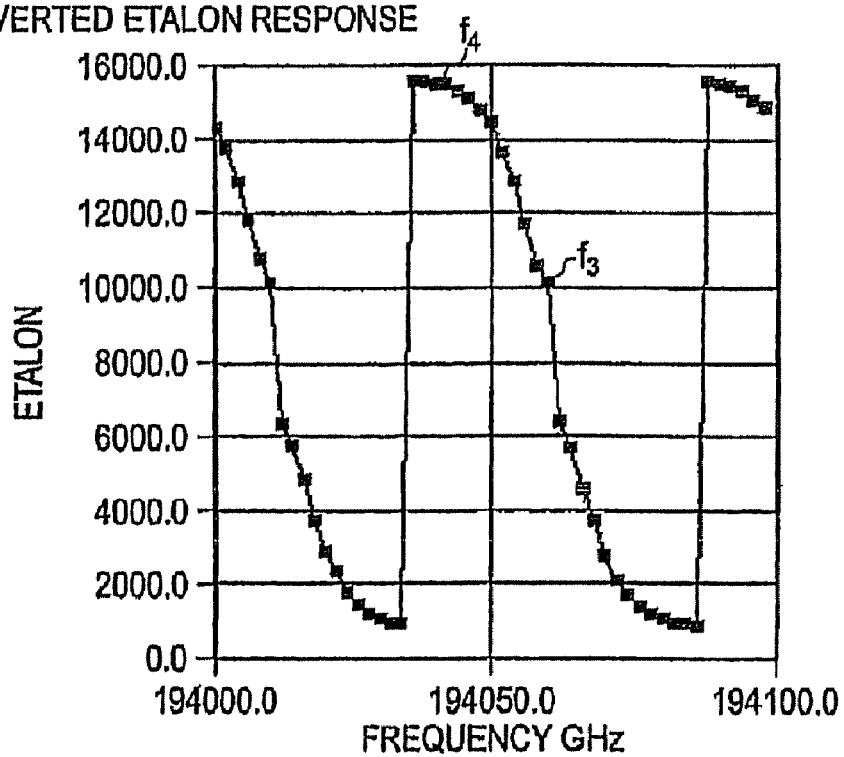

FIG. 13*b* shows how this problem is addressed in the second embodiment. The problem is addressed by inverting all portions of the etalon response curve that are of either one or the other sign in gradient. In the illustrated example, all portions of the response curve with a positive slope are inverted such that the entire line shape consists of portions which have a negative gradient. This means that, within a single period, the feedback circuit will always be able to drag $f_{output}$ in the right direction towards the target frequency. Accordingly, only a single feedback circuit is required. It is also worth noting that after inversion, the effective locking range of the etalon has been doubled. A full period of the response curve is now available for locking. This also has a beneficial effect when jumping between supermodes since overshoots and undershoots in landing frequency that are twice as big can now be accommodated.

A further measure that can be taken to facilitate locking to a fine frequency grid is to introduce a variable gain envelope on the feedback signal, which matches the varying slope of the etalon response curve. In this example, the sensitivity of the locking circuit to deviations in frequency is far greater at $f_3$=194060 GHz than at $f_4$=194042 GHz. Accordingly, the feedback signal at $f_4$ should be enhanced over that at $f_3$. Equalisation can be imposed on the signals provided by photodiodes PD1 and PD2 with an analogue amplifier arranged prior to the ADC. The use of variable gain enhancement on the feedback signal greatly improves the sensitivity of the locking circuit near the extremes of the etalon response curve, thereby reducing the time taken for an erroneous output frequency to be dragged back to the target frequency. This feature is normally implemented by incorporation of variable gain potentiometer values in the LUT of the microprocessor, where the gain for each set point in the sweep has associated with it, in the most general case, a potentiometer value. This potentiometer value compensates for the variation of the loop gain due to the variable slope of the frequency-referencing element rather than using a transformation such as a Ln (natural log) which is much more complicated to achieve and cannot be simply done with analogue circuitry, or than using a non-linear electronic element as a transfer function to normalise the gain.

The gain described above can be used to adjust the response of the etalon so that the desired frequency occurs at the same or similar response value. This reduces the need to adjust the target locking value by large amounts and can reduce any switching transients as the laser is switched from one channel to the next and hence allows faster switching of the laser.

In addition to the gain, an offset can also be used to achieve exact matching between the target response value and the effective slope of the etalon response for all target frequencies so as to normalise the desired locking value from the controller.

In a further implementation of this variable gain updating, a policy of having more that one gain value associated with specific steps in the frequency sweep may be employed. This two step updating of the loop gain ensures better loop stability in cases where the frequency transient is large and the locking range is small or decreasing. For example, for frequency greater than the ITU frequency of the etalon response and where a supermode jump has just been experienced. In this situation each value (row) in the standard LUT would have two gain potentiometer values associated with it.

An alternative to gain equalisation is to use an etalon with a sawtooth response as may be provided by a phase shift interferometer (PSI). A sawtooth function has a unipolar slope dT/df which can be almost constant as the number of phase shifting elements in the PSI technique employed increases. For example, for a 4 term PSI strategy, where four signals with π/2 phase shift between each quadrature signal, are processing the slope is unipolar and the slope value is virtually constant over the free spectral range of the PSI locker. Employing this type of frequency referencing element foregoes the need for gain equalisation required when a standard 50 GHz FSR etalon is employed.

The invention claimed is:

1. A system comprising:
   a multisection diode laser with a plurality of sections that are drivable by control inputs to select a desired output mode from among a plurality of available output modes;
   a wavelength locker configured to lock the selected output mode to a target frequency, where the wavelength locker has a characteristic response period and there are at least two target frequencies in each response period of the wavelength locker; and
   a controller configured to
   (i) sweep the diode laser in a pre-determined frequency direction through a series of frequency points by asserting a pre-calibrated series of sets of control input values to the sections of the diode laser and
   (ii) use the wavelength locker to lock to each of the frequency points,
   wherein the controller is configured to obtain frequency points from cavity modes in a plurality of different supermodes,
   and to pre-determine the sets of control input values to take account of thermal transients that are known to arise from jumps in the output modes that occur when sweeping through the pre-calibrated series of sets of control input values in the pre-determined frequency direction.

2. The system of claim 1, wherein the controller is further operable to sweep the diode laser in the opposite frequency direction by asserting a further pre-calibrated series of sets of control input values to the sections of the diode laser, wherein the further pre-calibrated sets of control input values take account of thermal transients that are known to arise from jumps in the output modes that occur when sweeping through the further pre-calibrated series of sets of control input values in the opposite frequency direction.

3. The system of claim 1, wherein at least one of the sets of control input values has control input values that deviate from their thermal equilibrium values by amounts dependent on the difference between the sum of its own control input values and those of the set of the preceding frequency point.

4. The system of claim 1, wherein each set of control input values defines an operating point in drive current space, and drive current space is subdivided into cells defined by the output modes of the laser, wherein at least one of the sets of control input values defines an operating point that is offset from the central region of its cell in a direction of a predicted transient thermal shift in the cell when arrived at by jumping from the preceding operating point.

5. The system of claim 1, wherein when a set of control input values defines an output mode in a different supermode from the output mode of the preceding set of control input values, the set of control input values is pre-determined so that the jump to that output mode is made to occur at a frequency midway between adjacent minima and maxima of the response of the wavelength locker.

6. The system of claim 1, wherein the response period of the locker enables the laser output to be tuned to any one of a plurality of discrete frequency channels separated by a fixed channel spacing.

7. The system of claim 6, wherein the response period of the locker enables the laser output to be tuned to any one of a plurality of discrete frequency channels separated by a fixed channel spacing, and wherein there are at least 4 frequency points in each response period of the wavelength locker.

8. The system of claim 1, wherein the frequency points are spaced apart by a constant frequency increment.

9. The system of any claim 1, further comprising a control circuit operable to output a correction signal for driving the diode laser that is dependent on the difference between a measured value output from the wavelength locker and a desired value output from the controller.

10. The system of claim 9, wherein the wavelength locker has a response with a frequency derivative which alternates in sign, and the control circuit is configured so that the correction signal has a magnitude independent of the sign of the difference.

11. The system of claim 9, wherein the wavelength locker has a response with a frequency derivative which alternates in sign, and the system comprises an inverter for inverting the measured value output of the wavelength locker at turning points in the response of the wavelength locker.

12. The system of claim 9, wherein the wavelength locker has a response with a frequency derivative which is always of the same sign.

13. The system of claim 1, wherein the control input values for each target frequency are stored in a look up table.

14. The system of claim 1 wherein the control input values for each target frequency are stored in a look up table and variable gain enhancement is used so as to normalise the wavelength locker slope, by incorporation of variable gain potentiometer values in the look up table.

15. The system of claim 14 where an offset is applied to normalise a desired locking value from the controller.

16. The system of claim 14 where an offset is applied to normalise a desired locking value from the controller and wherein the offset is stored as part of the lookup table of the laser for each target frequency.

* * * * *